United States Patent
Takeuchi et al.

(10) Patent No.: US 6,441,480 B1
(45) Date of Patent: *Aug. 27, 2002

(54) MICROELECTRONIC CIRCUIT PACKAGE

(75) Inventors: Timothy M. Takeuchi; Imran Yusuf, both of Tempe; Johnny M. Cook, Jr., Glendale, all of AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/379,537

(22) Filed: Aug. 24, 1999

(51) Int. Cl.⁷ .............................................. H01L 23/10
(52) U.S. Cl. ...................... 257/706; 257/718; 257/727
(58) Field of Search .................... 257/718, 706, 257/719, 726, 727

(56) References Cited

U.S. PATENT DOCUMENTS

| | | | |
|---|---|---|---|
| 4,716,494 A | 12/1987 | Bright et al. ............... | 361/386 |
| 4,872,089 A | 10/1989 | Ocken et al. ............... | 361/388 |
| 5,381,042 A | 1/1995 | Lerner et al. ............... | 257/712 |
| 5,436,798 A | 7/1995 | Wieland, Jr. ............... | 361/710 |
| 5,777,345 A | 7/1998 | Loder et al. ............... | 257/777 |
| 5,831,829 A | * 11/1998 | Lin ............................ | 257/718 |
| 6,153,932 A | * 11/2000 | Lin ............................ | 257/718 |

* cited by examiner

*Primary Examiner*—Roy Potter
(74) *Attorney, Agent, or Firm*—Schwegman, Lundberg, Woessner & Kluth, P.A.

(57) ABSTRACT

A microelectronic package comprises a substrate, a electronic chip mounted on the substrate, a thermal interface material, a spring clip, and a retention frame. The thermal interface material is located between the electronic chip and the slug and is capable of thermally coupling the electronic chip to a slug without curing. The spring clip is located between the retention frame and the slug. In the assembled microelectronic package, the retention frame caps the substrate, and the spring clip applies a constant force to the slug to ensure reliable and continuous thermal contact between the electronic chip and the slug.

22 Claims, 4 Drawing Sheets

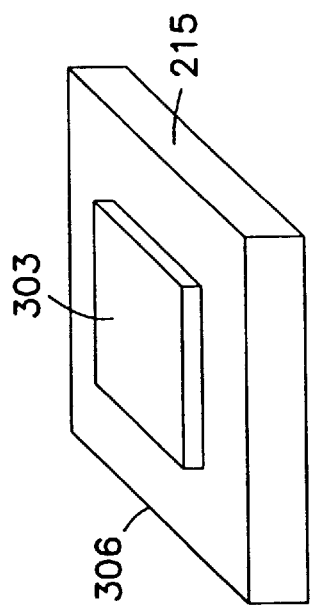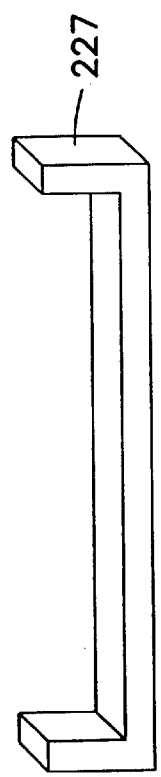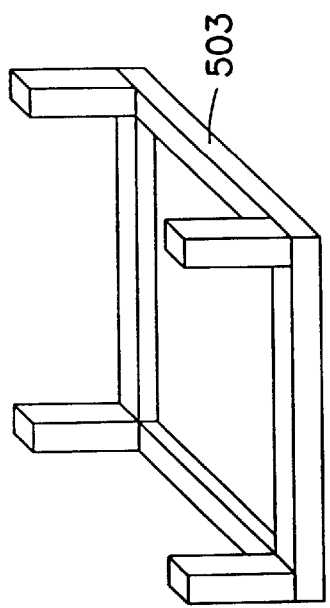
Figure 3
Figure 4
Figure 5

MICROELECTRONIC CIRCUIT PACKAGE

FIELD

This invention relates to the packaging of circuits, and more particularly to the packaging of microelectronic circuits.

BACKGROUND

As the density of circuit elements, such as resistors, capacitors, and transistors, is increased in a microelectronic circuit, heat generated by the circuit elements during the operation of the circuit increases. This heat conducts through the chip on which the microelectronic circuit is fabricated and must be efficiently removed from the chip. Failure to efficiently remove the heat from the chip can result in catastrophic failure of the microelectronic circuit.

FIG. 1 is a cross-sectional view of prior art microelectronic circuit package 100. Microelectronic circuit package 100 comprises substrate 103, encapsulated solder balls 106, electronic chip 109, thermal interface material 112, integrated heat spreader 115, and sealant material 118. Substrate 103 is a fragile sandwich of conductors and insulators formed on a ceramic base. Encapsulated solder balls 106 provide a conductive path for signals routed between electronic chip 109 and substrate 103. Thermal interface material 112 is a cured epoxy and is capable of transmitting heat from electronic chip 109 to integrated heat spreader 112. Integrated heat spreader 115 is a complex machined device that efficiently dissipates heat into the air and is secured to substrate 103 by sealant material 118. The bond provided by sealant material 118 between integrated heat spreader 115 and substrate 103 hermetically seals the space enclosed by substrate 103 and integrated heat spreader 115.

Unfortunately, there are several problems with microelectronic package 100. First, integrated heat spreader 115 is a complex machined device that is expensive to manufacture. Second, thermal interface material 112 is a cured epoxy that takes a significant amount of time to cure, which slows the manufacturing process, and increases the cost of the package.

Other problems with microelectronic package 100 arise as the heat flow in electronic chip 109 increases. First, the mismatch between the coefficients of thermal expansion of integrated heat spreader 112, thermal interface material 112, and electronic chip 109, causes electronic chip 109 to tear away from integrated heat spreader 112 and generate voids and uneven heat flow in thermal interface material 112. Second, the mismatch between the coefficients of thermal expansion of heat spreader 112 and substrate 103 cause integrated heat spreader 112 to tear away from substrate 103, which breaks sealant material 118, destroying the hermetic seal and structurally damaging the fragile conductors and insulators of substrate 103.

For these and other reasons there is a need for the present invention.

SUMMARY

An electronic chip package comprises an electronic chip, a slug thermally coupled to the electronic chip, and a mechanism capable of exerting a constant force on the slug.

BRIEF DESCRIPTION OF THE DRAWINGS

FIG. 3 is a perspective view of one embodiment of a slug of the present invention.

FIG. 4 is a perspective view of one embodiment of a spring clip of the present invention.

FIG. 5 is a perspective view of an alternate embodiment of a spring clip of the present invention.

DESCRIPTION

Figure 1:
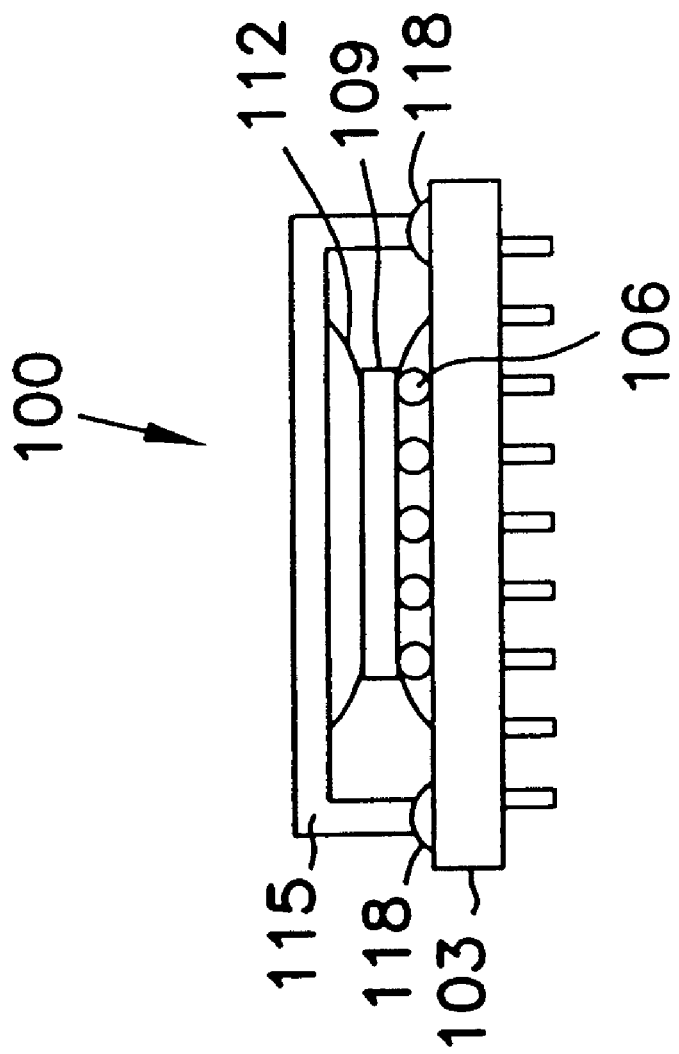
FIG. 1 is a cross-sectional view of a prior art microelectronic circuit package.
Figure 2:
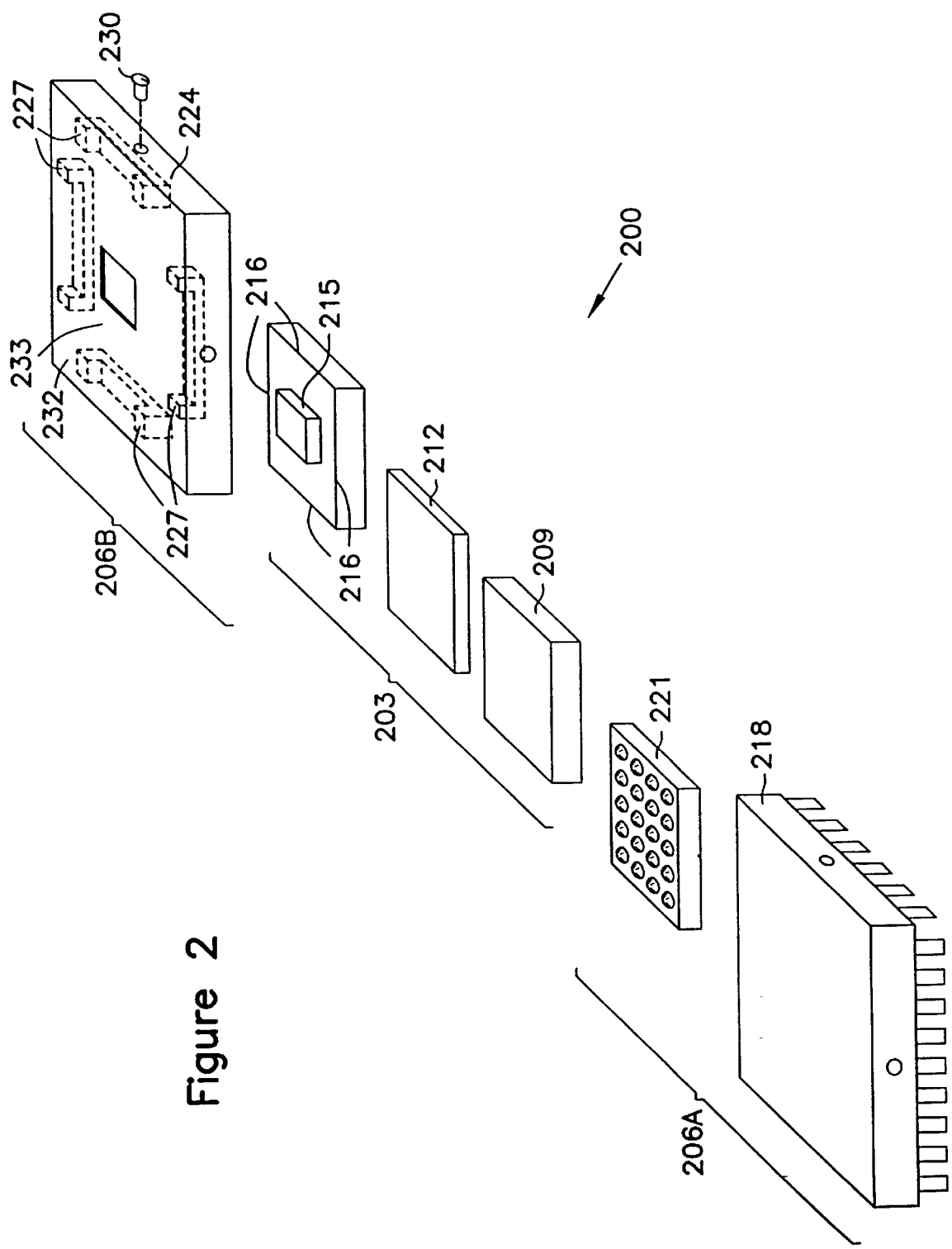
FIG. 2 is an exploded perspective view of some embodiments of the microelectronic circuit package of the present invention.

The illustrative microelectronic circuit package 200 shown in the accompanying drawings is particularly suited to the packaging of high performance microprocessors. FIG. 2 is an exploded perspective view of microelectronic circuit package 200 comprising chip-slug unit 203, packaging assembly 206A, and packaging assembly 206B.

Chip-slug unit 203 comprises electronic chip 209, thermal interface material 212, and slug 215. Electronic chip 209 includes microelectronic circuits that produce heat during their normal operation. An advantage of microelectronic package 200, which is capable of removing heat from electronic chip 209, is that it is not limited to use in connection with a particular chip substrate material or a particular circuit technology. Some chip substrate materials that are suitable for use in connection with the present invention include silicon, germanium, gallium arsenide, silicon-on-sapphire, and silicon-on-insulator. Some circuit technologies that are suitable for use in connection with the present invention include bipolar junction transistor (BJT) technologies and metal-oxide-semiconductor (MOS) technologies. In one embodiment, electronic chip 209 is a microprocessor chip fabricated in a MOS technology. Alternatively, electronic chip 209 is an application specific integrated circuit (ASIC) fabricated in more than one technology or a memory chip fabricated in a MOS technology. Another advantage of microelectronic package 200 is that a single packaging technology is suitable for packaging a variety of electronic chips that make up a complex electronic system.

Slug 215 has a plurality of edges 216 and is fabricated from a material having high thermal conductivity, such as copper or a copper alloy. One function of slug 215 is to remove heat from electronic chip 209, so the greater the thermal conductivity of slug 215, the more efficiently slug 215 removes heat from electronic chip 209. Slug 215 preferably has a shape that is easy to manufacture and that efficiently conducts heat away from electronic chip 209. In one embodiment, slug 215 is a single thermally conductive plate, such as a square copper plate. Preferably, slug 215 has the shape of two stacked plates. In one embodiment, slug 215 has the shape of a plurality of stacked square or rectangular plates, with each of the stacked plates having a perimeter that is less than the plate below. FIG. 3 shows slug 215 having the shape of two stacked square plates, where the top plate perimeter 303 is less than the bottom plate perimeter 306. Slug 215 is not limited to square or rectangular plates. Plates in the shape of a polygon, such as triangular, octagonal, or hexagonal plates, or circular plates are also suitable for use in the fabrication of slug 215. An advantage that flows from fabricating slug 215 as a plurality of stacked plates is that it is fabricated using simple and inexpensive manufacturing operations. In one embodiment, slug 215 is fabricated using a single punch operation. Alternatively, slug 215 is fabricated by an extrusion process. In still another embodiment, slug 215 is fabricated using a simple stamping operation.

In assembling chip-slug unit 203, thermal interface material 212 is sandwiched between electronic chip 209 and slug 215 to thermally couple the heat flowing in electronic chip 209 to slug 215. An advantage of the present invention is that an uncured material is suitable for use as thermal interface material 212. Using an uncured material for thermal interface material 212 reduces the time and cost of manufacturing microelectronic package 200. In one embodiment, thermal interface material 212 is a two-phase material. In an alternate embodiment, thermal interface material 212 is a two-component flexible epoxy adhesive. Thermal interface materials are manufactured in a variety of forms, which allows the designer of chip-slug unit 203 to tune the thermal interface between the electronic chip 209 and the slug 215. For example, if a thermal tape does not provide a sufficient gap between electronic chip 209 and slug 215, then a thermal gel may be used. In one embodiment, thermal interface material 212 is a thermal tape. In an alternate embodiment, thermal interface material 212 is a thermal mesh. In still another alternate embodiment, thermal interface material 212 is a thermal gel.

Packaging assembly 206A comprises substrate 218 and encapsulated solder balls 221, and packaging assembly 206B comprises retention frame 224, spring clip 227, and retention frame attachment feature 230.

Substrate 218 is not limited to a particular material. Any material that is suitable for use as a substrate in a microelectronic package is suitable for use in connection with the fabrication of substrate 218. Preferably, the material selected for substrate 218 provides a solid structural base for mounting electronic chip 209, provides a solid electrical base for fabricating conductive structures to route signals from electronic chip 209 through solder balls 221 to the pins of substrate 218, and is chemically inert. In one embodiment, substrate 218 is fabricated from a ceramic. Alternatively, substrate 218 is fabricated from a plastic. Preferably, substrate 218 is fabricated from an organic material. The solder balls included in encapsulated solder balls 221 are fabricated from solder comprising tin or a tin alloy, and are encapsulated in an epoxy.

Retention frame 224 caps and protects substrate 218 and electronic chip 209 from physical damage. Retention frame 224 is preferably fabricated from a material that is inexpensive and easily shaped. In one embodiment, retention frame 224 is fabricated from a plastic. In an alternate embodiment, retention frame 224 is fabricated from steel or stainless steel. Retention frame 224 is shaped as a cap to cover and protect the top and sides of the assembly of chip-slug unit 203 and substrate 218. In one embodiment, retention frame 224 has a top surface 232, and top surface 232 has a center cut hole 233 for exposing slug 215 to the air outside retention frame 224 for the purpose of dissipating heat. In one embodiment, slug 215 is capable of partially extending through hole 233. Any manufacturing process capable of shaping metal parts is suitable for fabricating retention frame 224. In one embodiment, retention frame 224 is a machined part. Preferably, retention frame 224 is formed by a stamping operation. Retention frame attachment feature 230 is capable of attaching or coupling retention frame 224 to substrate 218. In one embodiment, retention frame attachment feature 230 is an attachment mechanism, such as a screw, pin, or clip.

Spring clip 227 exerts a constant force on slug 215 when chip-slug unit 203 is assembled with packaging assembly 206A and 206B. By exerting a constant force on slug 215, a constant thermal coupling is maintained between electronic chip 209 and slug 215. In one embodiment, spring clip 227 is fabricated as an integral part of retention frame 224. In an alternate embodiment, spring clip 227 is fabricated separately from retention frame 224 and attached to retention frame 224 in a separate manufacturing operation. Spring clip 227 is preferably fabricated from a material that is capable of maintaining a constant force after deformation. In one embodiment, spring clip 227 is fabricated from plastic. In an alternate embodiment, spring clip 227 is fabricated from steel. Preferably, spring clip 227 is fabricated from stainless steel. FIG. 4 is a perspective view of one embodiment of spring clip 227 having a u-shape. FIG. 5 is a perspective view of one embodiment of spring clip 503 fabricated as a single piece of stainless steel.

In the assembly of one embodiment of microelectronic circuit package 200, encapsulated solder balls 221 are mounted on substrate 218. Substrate 218 provides electrical coupling from encapsulated solder balls 221 to the pins of the substrate 218. The electrical coupling is provided by fragile layers of conductors and insulators embedded in substrate 218. An advantage of the present invention is that the assembly of microelectronic circuit package 200 is fabricated in a way that avoids damaging the fragile layers of conductors and insulators during heating and cooling cycles of electronic chip 209. Chip-slug unit 203 is mounted on encapsulated solder balls 221. Chip-slug unit 203 comprises electronic chip 209, slug 215, and thermal interface material 212 sandwiched between electronic chip 209 and slug 215. Electronic chip 209 is electrically coupled to substrate 218 through encapsulated solder balls 221. Electronic chip 209 is thermally coupled to slug 215 through thermal interface material 212. Retention frame 224 fits over chip-slug unit 203, and attaches to substrate 218. Spring clip 227 is located on an inner surface of retention frame 224 and contacts chip-slug unit 203 along the perimeter of slug 215. After the assembly of chip-slug unit 203 and packaging assembly 206A and packaging assembly 206B, retention frame 224 caps substrate 218, and spring clip 227 exerts a constant force on slug 215 in order to maintain thermal coupling between electronic chip 209 and slug 215.

Figure 6:
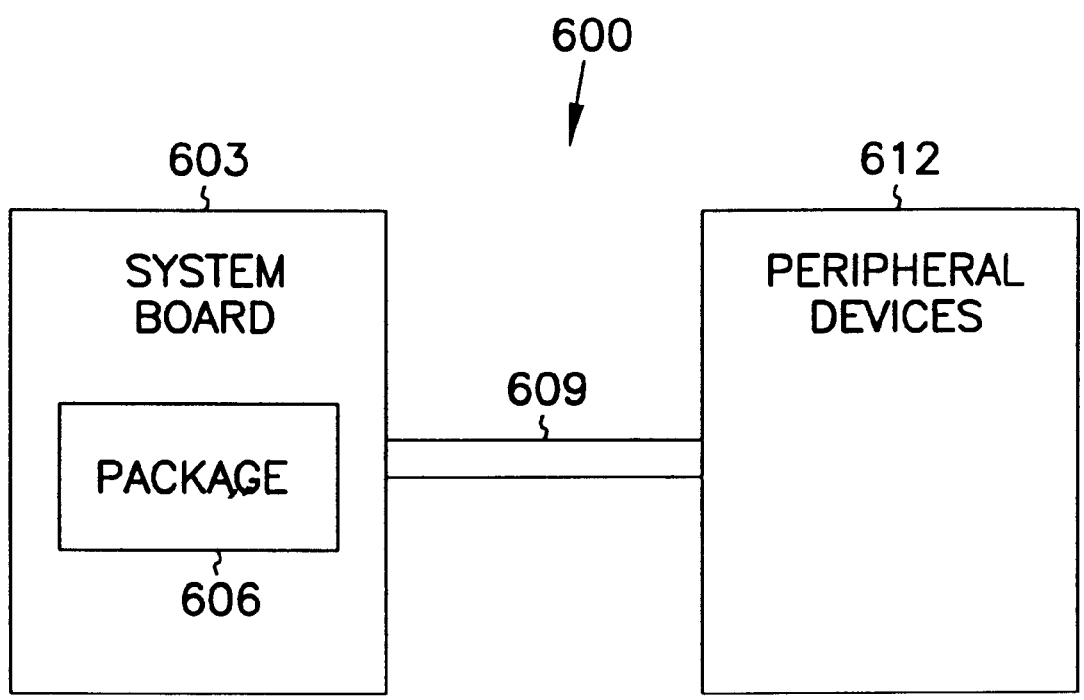
FIG. 6 is a block diagram of one embodiment of a computer system suitable for use in connection with the present invention.

FIG. 6 is a block diagram of one embodiment of computer system 600 including system board 603, electronic chip package 606, system bus 609, and peripheral devices 612. Electronic chip package 606 includes a substrate, a processor mounted on the substrate, a slug thermally coupled to the processor, and a retention frame including a spring clip. The spring clip is capable of exerting a force on the slug to maintain thermal coupling between the slug and the processor. Electronic chip package 606 is mounted on system board 603 and peripheral devices 612 are coupled to system board 603 through system bus 609. Although specific embodiments have been illustrated and described herein, it will be appreciated by those of skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An electronic chip package comprising:
   an electronic chip;
   a slug thermally coupled to the electronic chip; and
   a mechanism capable of exerting a constant force on the slug, wherein the mechanism comprises:
   a retention frame;
   a spring clip in contact with the retention frame; and a substrate coupled to the electronic chip and the retention frame, wherein the retention frame has a top surface having a hole and the slug is capable of partially extending through the hole.

2. An electronic chip package comprising:
an electronic chip;
a slug;
an uncured material located between the electronic chip and the slug, the uncured material is capable of thermally coupling the electronic chip to the slug; and
a mechanism capable of maintaining constant thermal coupling between the electronic chip and the slug.

3. The electronic chip package of claim 2, wherein the uncured material is a gel.

4. The electronic chip package of claim 2, wherein the uncured material is a thermal tape.

5. The electronic chip package of claim 4, wherein the thermal tape is a mesh.

6. An electronic chip package comprising:
a substrate;
an electronic chip mounted on the substrate;
a slug thermally coupled to the electronic chip; and
a retention frame including a spring clip, wherein the spring clip is capable of exerting a force on the slug, wherein the substrate is a ceramic.

7. An electronic chip package comprising:
a substrate;
an electronic chip mounted on the substrate;
a slug thermally coupled to the electronic chip; and
a retention frame including a spring clip, wherein the spring clip is capable of exerting a force on the slug, wherein the substrate is a ceramic and the electronic chip is a microprocessor.

8. An electronic chip package comprising:
a substrate;
an electronic chip mounted on the substrate;
a slug thermally coupled to the electronic chip, the slug comprising a plurality of stacked plates; and
a retention frame including a spring clip, wherein the spring clip is capable of exerting a force on the slug.

9. An electronic chip package comprising:
a substrate;
an electronic chip electrically coupled to the substrate;
a slug thermally coupled to the electronic chip; and
a retention frame having a top surface having a hole through which the slug is capable of extending, and the retention frame including a spring clip, wherein the spring clip is capable of exerting a force on the slug to maintain thermal coupling between the slug and the electronic chip, and the retention frame is capable of attaching to the substrate.

10. The electronic chip package of claim 9, wherein the electronic chip is thermally coupled to the slug by an uncured material.

11. The electronic chip package of claim 9, wherein the force exerted by the spring clip on the slug is between about 5 and 25 pounds.

12. An electronic chip package comprising:
a substrate;
an electronic chip mounted on the substrate;
a slug comprising a plurality of stacked plates thermally coupled to the electronic chip; and
a retention frame including a spring clip, wherein the spring clip is capable of exerting a force on the slug.

13. The electronic chip package of claim 12, wherein the slug is manufactured in two or fewer steps.

14. The electronic chip package of claim 12, wherein the slug is thermally coupled to the electronic chip by a two-phase material.

15. The electronic chip package of claim 12, wherein the slug has a coefficient of thermal expansion and the electronic chip has a coefficient of thermal expansion that differs from the coefficient of thermal expansion of the slug.

16. An electronic chip package comprising:
a substrate;
an electronic chip electrically coupled to the substrate;
a slug thermally coupled to the electronic chip by an uncured material; and
a retention frame including a plurality of spring clips, wherein the plurality of spring clips are capable of exerting a force on the slug to maintain thermal coupling between the slug and the electronic chip.

17. The electronic chip package of claim 16, wherein the slug has a perimeter and the plurality of spring clips contact the slug near the perimeter of the slug.

18. The electronic chip package of claim 16, wherein the slug has a plurality of edges and the plurality of spring clips are capable of applying a constant load parallel to the plurality of edges of the slug.

19. An electronic chip package comprising:
a substrate comprising an organic material;
an electronic chip electrically coupled to the substrate;
a slug thermally coupled to the electronic chip by an uncured material; and
a retention frame including a plurality of spring clips, wherein the plurality of spring clips are capable of exerting a force on the slug to maintain thermal coupling between the slug and the electronic chip.

20. An electronic chip package comprising:
a substrate;
an electronic chip electrically coupled to the substrate;
a slug thermally coupled to the electronic chip by an uncured material; and
a retention frame including four spring clips, wherein the four spring clips are capable ot exerting a force on the slug to maintain thermal coupling between the slug and the electronic chip.

21. An electronic chip package comprising:
a substrate;
an electronic chip electrically coupled to the substrate;
a slug thermally coupled to the electronic chip by a gel; and
a retention frame including a plurality of spring clips, wherein the plurality of spring clips are capable of exerting a force on the slug to maintain thermal coupling between the slug and the electronic chip.

22. A computer system comprising:
a system board; and
an electronic chip package mounted on the system board, the electronic chip package comprising:
a substrate;
a processor mounted on the substrate;
a slug thermally coupled to the processor; and
a retention frame including a spring clip, wherein the spring clip is capable of exerting a force on the slug to maintain thermal coupling between the slug and the processor.

* * * * *